United States Patent
He et al.

(10) Patent No.: US 9,293,910 B2
(45) Date of Patent: Mar. 22, 2016

(54) POWER BATTERY ASSEMBLY AND ELECTRIC VEHICLE COMPRISING THE SAME

(71) Applicants: Shenzhen BYD Auto R&D Company Limited, Guangdong (CN); BYD COMPANY LIMITED, Guangdong (CN)

(72) Inventors: Long He, Guangdong (CN); Jianhua Zhu, Guangdong (CN); Qing Lai, Guangdong (CN); Zhiwei Tong, Guangdong (CN); Zhipei Lu, Guangdong (CN)

(73) Assignee: SHENZHEN BYD AUTO R&D COMPANY LIMITED, Shenzhen (CN)

( * ) Notice: Subject to any disclaimer, the term of this patent is extended or adjusted under 35 U.S.C. 154(b) by 115 days.

(21) Appl. No.: 14/359,842

(22) PCT Filed: Nov. 26, 2012

(86) PCT No.: PCT/CN2012/085298
§ 371 (c)(1),
(2) Date: May 21, 2014

(87) PCT Pub. No.: WO2013/075672
PCT Pub. Date: May 30, 2013

(65) Prior Publication Data
US 2015/0016002 A1  Jan. 15, 2015

(30) Foreign Application Priority Data
Nov. 25, 2011 (CN) ...................... 2011 2 0476562 U

(51) Int. Cl.
*H02H 3/00* (2006.01)
*H02H 3/093* (2006.01)
*H02H 7/18* (2006.01)
(Continued)

(52) U.S. Cl.
CPC ........... *H02H 3/093* (2013.01); *G01R 19/0092* (2013.01); *H02H 7/18* (2013.01); *G01R 15/207* (2013.01); *H02H 3/0935* (2013.01); *H02J 7/0026* (2013.01)

(58) Field of Classification Search
USPC .............................................. 361/86–87, 93.9
See application file for complete search history.

(56) References Cited

U.S. PATENT DOCUMENTS

| 2003/0142449 | A1 | 7/2003 | Iwata et al. |
| 2003/0169007 | A1* | 9/2003 | Ashiya ..................... H02P 29/02 318/471 |
| 2010/0127663 | A1 | 5/2010 | Furukawa et al. |
| 2011/0050000 | A1 | 3/2011 | Park |
| 2012/0169117 | A1* | 7/2012 | Park ..................... B60L 11/1861 307/10.7 |

FOREIGN PATENT DOCUMENTS

| CN | 101740840 A | 6/2010 |
| CN | 101741121 A | 6/2010 |

(Continued)

*Primary Examiner* — Danny Nguyen
(74) *Attorney, Agent, or Firm* — Brinks Gilson & Lione

(57) ABSTRACT

A power battery assembly may include a battery circuit and a circuit protecting unit. The circuit protecting unit may be connected in series with the battery circuit. The circuit protecting unit may include a relay and a current sensing unit connected in series with the battery circuit. A switching unit is connected with the relay for controlling the switching of the relay, and a controller is connected with the switching unit and to the current sensing unit to control switching on or switching off the switching unit based on comparison of the current value detected by the current sensing unit, and sent to the controller with a first predetermined current value.

11 Claims, 2 Drawing Sheets

(51) Int. Cl.
   *G01R 19/00*  (2006.01)
   *H02J 7/00*  (2006.01)
   *G01R 15/20*  (2006.01)

(56) References Cited

FOREIGN PATENT DOCUMENTS

| CN | 202455044 U | 9/2012 |
|----|----|----|
| EP | 2 448 075 A1 | 5/2012 |
| JP | 2006-303728 | 10/1994 |
| JP | 9009514 A | 1/1997 |
| JP | 2008-125191 | 5/2008 |
| JP | 2009-219285 | 9/2009 |
| JP | 2009-219286 | 9/2009 |
| JP | 2010183679 A | 8/2010 |
| JP | 2011010393 A | 1/2011 |
| KR | 19980041925US | 9/1998 |
| KR | 20110021397 A | 3/2011 |
| KR | 20110085713 A | 7/2011 |

\* cited by examiner

POWER BATTERY ASSEMBLY AND ELECTRIC VEHICLE COMPRISING THE SAME

CROSS-REFERENCE TO RELATED APPLICATIONS

This application claims priority to and benefit of International Application PCT/CN2012/085298 filed Nov. 26, 2013, which claims priority to and benefit of Chinese Patent Application Serial No. 201120476562.5, filed on Nov. 25, 2011, the entire contents of which applications are incorporated herein by reference.

FIELD OF THE INVENTION

The present disclosure relates to the field of vehicle, more particularly to a power battery assembly and an electric vehicle.

BACKGROUND

The statements in this section provide background information related to the present disclosure and do not constitute prior art.

With an improved requirement to protect environment, electric vehicles or hybrid vehicles represent future direction in substitution of conventional gasoline vehicles, and as a core component, a power battery is becoming ever more important. The in-vehicle battery requires excellent high rate discharge property and safety performance, since the in-vehicle power battery has to survive in harsh environment or adverse conditions.

Short circuit and unremitting overload may bring negative impact to battery lifespan, even render grave accident. Currently, rapid type fuse may be adopted inside a power battery assembly with the characteristic of rapid responsiveness, and under some conditions, a slow type fuse may also be used. However, harmonic waves and pulse currents may accompany work current fluctuation in the power battery assembly, which may cause error in operation and shorten the lifespan of the fuses. In addition, the fuse has to be replaced before the power battery assembly may be run again for driving, for example, an electric car, which may need additional maintenance time with increased cost.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In viewing thereof, the present disclosure is directed to solve at least one of the problems existing in the art. Accordingly, a power battery assembly may be provided, which may reduce maintenance time as well as costs.

According to an aspect of the present disclosure, a power battery assembly may be provided, including: a battery circuit having a plurality of battery modules connected in series and/or in parallel; a circuit protecting unit connected in series with the battery circuit having: a relay and a current sensing unit connected in series with the battery circuit, with the current sensing unit detecting a value of a current passing through the relay; a switching unit connected with the relay for controlling on/off of the relay; and a controller connected with the switching unit and the current sensing unit to control the switching on or switching off of the switching unit based on comparison of the value of the current which is detected by the current sensing unit and sent to the controller with a first predetermined current value, and if the current has the value larger than the first predetermined current value and lasts for a first predetermined time period, the switching unit is switched off under the control of the controller, so that the relay is switched off.

With the power battery assembly according to an embodiment of the present disclosure, predetermined currents may be preset in the controller, achieving current overload and short-circuit protection whereas avoiding uncontrollability of a conventional fuse. In addition, when the working current is restored to a normal value, the switching circuit may be switched on under the controlling of the controller, so that the relay in the power battery assembly may be closed to restore the power battery assembly in normal use very quickly, without even any component substitution or the cost relating thereto.

According to an embodiment of the present disclosure, an electric vehicle including the power battery assembly may be provided. Other advantages and features of the disclosure are described below.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
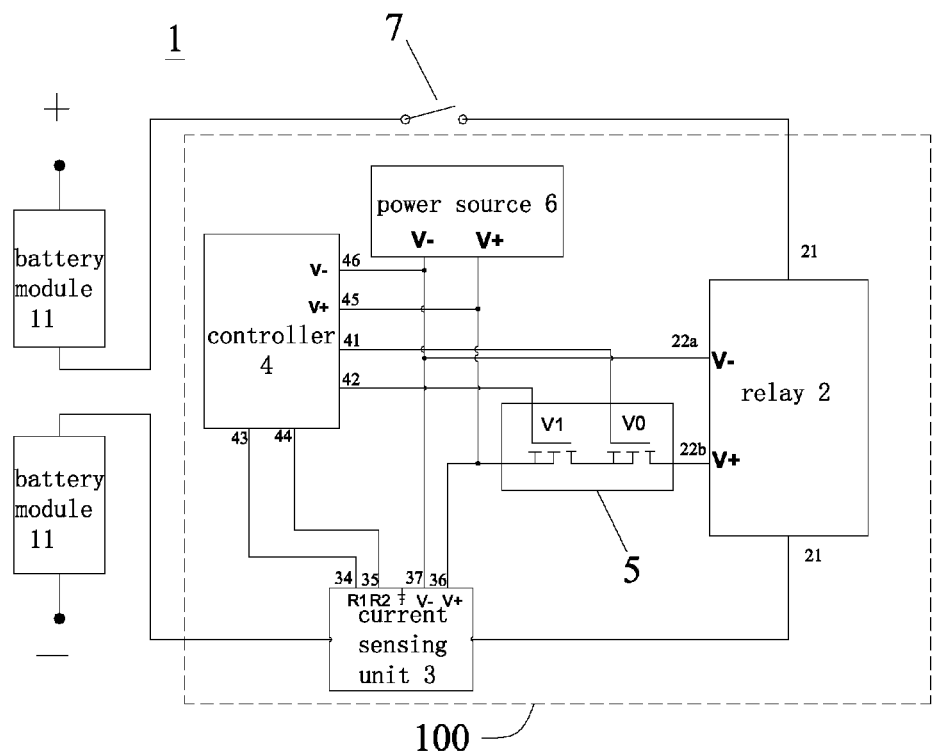
FIG. 1 is a schematic diagram of a power battery assembly according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. It is to be understood that, the embodiments described herein are merely used to generally understand the present disclosure, but shall not be construed to limit the present disclosure.

In the following, a power battery assembly 1 which may be protected from current overload or short-circuit may be explained for illustration with reference to accompanying figures, in which like figure numerals represent like components or parts in the following context. FIG. 1 is a schematic diagram of the power battery assembly 1. And FIG. 2 is a perspective view of the power battery assembly 1.

As shown in FIG. 1, the power battery assembly 1 may include battery circuit having a plurality of battery modules 11 connected in series or in parallel (or a combination thereof) and a circuit protecting unit 100. The circuit protecting unit 100 may be connected in series with the battery circuit, and may have a relay 2, a current sensing unit 3, a switching unit 5, and a controller 4. The relay 2 and the current sensing unit 3 may be connected in series with the battery circuit, with the current sensing unit 3 detecting a value of a current passing through the relay 2. In one embodiment, the switching unit 5 may be connected with the relay 2 for controlling the relay 2. That is, when the current falls within the normal value, the switching unit 5 is switched on and the relay 2 is switched on. When the current is abnormal, the switching unit 5 is switched off, and the relay 2 is shut down. The controller 4 may be connected with the switching unit 5 and the current sensing unit 3 to control the switching on or switching off of the switching unit 5 based on comparison of the value of the current, detected by the current sensing unit 3 and sent to the controller 4, with a first predetermined current value. And if the current has the value larger than the first predetermined current value and lasts for a first predetermined time period, the switching unit 5 may be switched off under the control of the controller 4. In one embodiment, the switching unit 5 may be switched off under the control of the controller 4 if the current detected by the current sensing unit 3 has a value larger than a second predetermined current value which is larger than the first predetermined current value and current flow lasts for a second predetermined time period. In one embodiment, the first predetermined current value may be an overload protecting current value of the power battery assembly 1, and the second predetermined current value may be a short-circuit current value of the power battery assembly 1. Alternatively, in another embodiment, the current value detected by the current sensing unit 3 may be an average value within a predetermined time duration.

With the power battery assembly 1 according to an embodiment of the present disclosure, predetermined currents may be preset in the controller 4, achieving overcurrent and short-circuit protection whereas avoiding uncontrollability of a conventional fuse. In addition, when the working current is restored to a normal value, the switching circuit 5 may be switched on under the controlling of the controller 4, so that the relay 2 in the power battery assembly 1 may be closed to restore the power battery assembly 1 in normal use very quickly, without even any component substitution or the cost relating thereto.

Figure 2:
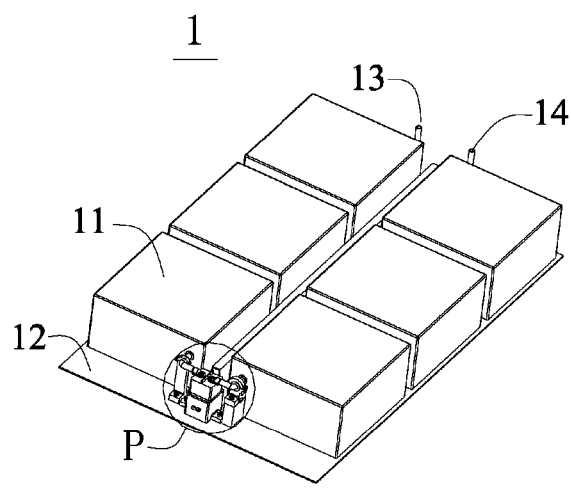
FIG. 2 is a perspective view of a power battery assembly according to an embodiment of the present disclosure.

Referring to FIG. 2, the battery modules may be connected in series or in parallel and may be provided on a battery supporting tray 12, and a positive terminal 13 and a negative terminal 14 may lead out from the power battery assembly 1. It should be noted that the battery module is commonly practiced in the art, therefore, the detailed description thereof may be omitted herein for clarity purpose.

Alternatively, in one embodiment, the relay 2, the controller 4 and the current sensing unit 3 may be powered by at least one of the plurality of the battery modules 11 with the switching unit 5 being connected in series between the at least one of the plurality of the battery modules 11 and the relay 2.

Figure 3:
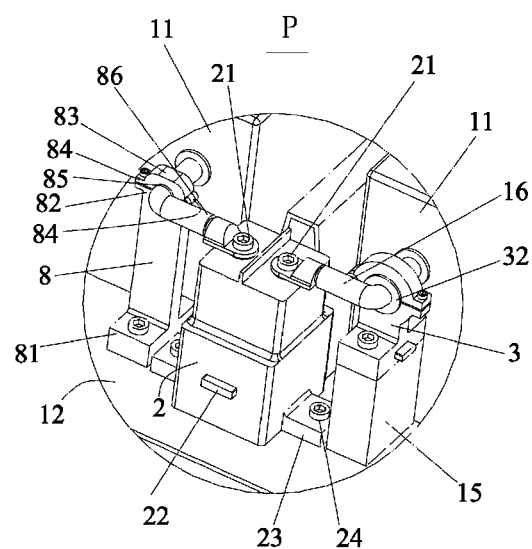
FIG. 3 is an enlarged partial view of a part indicated by reference letter P shown in FIG. 2.

Referring to FIGS. 1 and 3, a normally open contact 21 of the relay 2 may be connected in series with the battery circuit, and coil windings 22 of the relay 2 may be connected with the switching unit 5 in series to form a sensing circuit. In one embodiment, a power source 6 for powering the relay 2, the controller 4 and the current sensing unit 3 may be provided in the power battery assembly 1, with the switching unit 5 being connected in series between the power source 6 and the relay 2. An end 22a of the coil windings 22 in the relay 2 may be connected with a negative electrode of the power source 6, and the other end 22b may be connected with the positive electrode of the power source 6 via the switching unit 5. In one embodiment, the relay 2 may be high-voltage DC relay with high power, such as Model GER-400 distributed by LSIS Co. Ltd, Korea with a rated working current of 400 A. And the rated current of the relay 2 may be larger than an upper limit of the normal working current of the power battery assembly 1. And the relay 2 may possess appropriate dimensional accuracy and temperature parameters, etc. as conditions may require.

As shown in FIG. 3, the relay 2 may include a base 23 formed with mounting holes 24, and the base 23 may be fixed with the battery supporting tray 12 via, for example, screws to avoid physical displacement. In one embodiment, the current sensing unit 3 may be a Hall sensor, and the Hall sensor 3 may include a first lead supporting member 31 formed with a via-hole 36 through which a first lead 16 connecting the relay 2 with the battery circuit via the Hall sensor 3 may pass, and a first elastic washer 32 may be provided between the via-hole 36 and the first lead 16 passing therethrough to prevent the first lead 16 from being damaged by the first lead supporting member 31 via frequent friction. The first elastic washer 32 may be formed, for example, by materials with excellent insulation and weather adaptability such as PP, PET, rubber etc.

Figure 4:
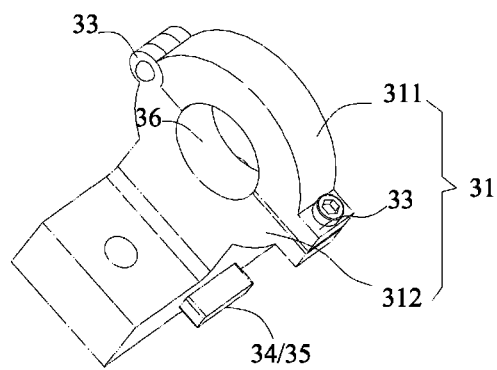
FIG. 4 is a schematic perspective view of a current sensor in a power battery assembly according to an embodiment of the present disclosure.

As shown in FIG. 4, the first lead supporting member 31 may include an upper ring 311 and a lower ring 312 with semi-annular shapes, and the upper ring 311 and the lower ring 312 may be hinged with each other via a connecting lug 33, with the other ends being detachably connected via bolts which is easy for assembly and disassembly.

In one embodiment, the Hall sensor 3 may include output terminals 34, 35 for connecting with the controller 4 and power terminals 36, 37. The current signal detected by the Hall sensor 3 may be transmitted to the controller 4 via the output terminals 34, 35, and the Hall sensor 3 may be powered by the power source 6 via the power terminals 36, 37.

As shown in FIG. 3, a mounting bracket 15 for supporting the current sensing unit 3 may be provided on the battery supporting tray 12, and the Hall sensor 3 may be fixed to the mounting bracket 15 via screws.

In one embodiment, the circuit protecting unit 100 may further include a lead supporting bracket 8 for supporting and fixing a second lead 86 connecting the relay 2 with the battery circuit (i.e. battery module 11). The lead supporting bracket 8 may be supported on the battery supporting tray 12. In one embodiment, the lead supporting bracket 8 may include: a base 81 fixed on the battery supporting tray 12, a lower semi-ring 82 fixed on the base 81, an upper semi-ring 83 mated with the lower semi-ring 82 via flanges 84 formed on the upper and lower semi-rings 82, 83 respectively. A second elastic washer 85 may be provided between the second lead 86 and an opening formed by the mated lower and upper semi-rings 82, 83. In one embodiment, the upper and lower semi-rings 82, 83 may be hinged at the flanges 84 and fixed with each other at the other flanges (not shown) opposite to the flanges 84 via screws. In one embodiment, a second elastic washer 85 may be provided between the upper and lower semi-rings 82, 83 and the second lead 86.

In one embodiment, as shown in FIG. 1, the switching unit 5 may include: a first MOSFET V0 and a second MOSFET V1 connected in series, with grid electrodes of the first MOSFET V0 and the second MOSFET V1 being connected with output terminals 41, 42 of the controller 4 respectively. A drain electrode of the MOSFET V1 may be electrically connected with the source electrode of the MOSFET V0, and a source electrode of the MOSFET V1 may be electrically connected with the positive electrode of the power source 6, a drain electrode of the MOSFET V0 may be electrically connected with the input terminal 24, as shown in FIG. 3. In one embodiment, the controller 4 performs the current overload and short-circuit protection independently, which will be described in detail in the following. And the switching may be controlled by the MOSFET V0 and the MOSFET V1 respectively. Only when the MOSFET V0 and the MOSFET V1 are switched on at the same time, may the coil windings 22 of the relay 2 be energized with the normally open contact 21 being switched on, thus the power battery assembly 1 may enter into a normal working state.

In one embodiment, the controller 4 may be an IC controller having input terminals 43, 44, output terminals 41, 42 and power terminals 45, 46. The input terminals 43, 44 may be connected to output terminals of the Hall sensor 3 respectively. As explained hereinabove, the output terminals 41, 42 may be connected with the grid electrodes of the MOSFET V0 and the MOSFET V1 respectively. And the power terminals 45, 46 may be connected with the positive and negative electrodes of the power source 6 respectively to be powered by the power source 6.

As stated above, the first predetermined current value may be stored in the controller 4 for the determination of normal working of the power battery assembly 1. For example, the power battery assembly 1 may have a working current of 250 A with a continuous working current of 450 A, and the power battery assembly 1 may have an overload protecting current of 300 A, i.e., the first predetermined current value, with a first duration, i.e. the first predetermined time period, less than 5 min. And the power battery assembly 1 may have a short-circuit protecting current of 600 A, i.e., the second predetermined current value with a maximum lasting duration, i.e., the second predetermined time period, of 30 seconds. Then the current in the battery module 11 is less than 250 A, the current value is detected by the Hall sensor 3 and sent to the controller 4. And the controller 4 compares the current value detected with the first predetermined current value, and outputs an up level resulting the switching on of the MOSFETs V0 and V1, and the coil windings 22 of the relay 2 is energized with the normally open contact 21 being closed, and the battery module 11 is switched on and the power battery assembly 1 enters into a normal working state. When the current in the power battery assembly 1 is larger than 250 A, the current value detected by the Hall sensor 3 may be sent to the controller 4, and the current value is compared with the first predetermined current value, and if the average value of the current within the first predetermined time period is larger than the first predetermined current value, the output terminal 41 corresponding to the overload protection outputs a low level, and the MOSFET V0 is switched off, the coil windings 22 of the relay 2 is de-energized, the normally open contact 21 is switched off, and the battery module 11 is switched off correspondingly to trigger the current overload protection.

When the current value in the power battery assembly 1 is larger than 450 A, the Hall sensor 3 detects the current value and send the current value to the controller 4, and the controller 4 compares the value of the current detected with the second predetermined current value, if the average value of the current detected within the second predetermined time period, for example, 30 seconds as mentioned above, is larger than the second predetermined current value, the output terminal 42 corresponding to the short-circuit protection outputs a lower level, and the MOSFET V1 is switched off, and the coil windings 22 of the relay 2 is de-energized, the normally open contact 21 is switched off, the battery module 11 is switched off correspondingly, triggering the current short-circuit protection.

For maintenance purpose, a switch 7 is electrically connected in series between the circuit protecting unit 100 and the battery circuit, as shown in FIG. 1, so that the power battery assembly 1 may be serviced when maintenance is necessary.

In the following, the working principles of the power battery assembly 1 will be described in brief. As shown in FIG. 1, when the battery modules 11 run in normal state, an up level is output by the controller 4, and the switching unit 5 is switched on, so that the coil windings 22 of the relay 2 is energized, resulting the close or switching on of the normally open contact 21 and ensuring the switching on of the battery modules 11.

When current overload or current short circuit occurs in any one of the battery modules 11, the controller 4 outputs a lower level, the switching unit 5 is switched off, and the coil windings 22 of the relay 2 is de-energized, the normally open contact 21 is switched off, the battery module 11 is switched off correspondingly, triggering the current overload or short-circuit protection accordingly.

When faults in the power battery assembly 1 are repaired, the power battery assembly 1 may enter into normal usage under the control of the controller 4, and there is no need for any component substitution, such as the conventional fuse, thus saving time and avoiding additional costs.

When faults in the power battery assembly 1 are repaired, the power battery assembly 1 may enter into normal usage under the control of the controller 4, and there is no need for any component substitution, such as the conventional fuse, thus saving time and avoiding additional costs.

In one embodiment, an electric vehicle including the power battery assembly 1 as described above may also be provided.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A power battery assembly, comprising:
a battery circuit having a plurality of battery modules;
a circuit protecting unit connected in series with the battery circuit, the circuit protecting unit having:
 a relay and a current sensing unit connected in series with the battery circuit, the current sensing unit configured to detect a value of a current passing through the relay;
 a switching unit connected with the relay for controlling the relay;
 a controller connected with the switching unit and to the current sensing unit, and configured to control switching on or off the switching unit based on comparison of the value of the current detected by the current sensing unit with a first predetermined current value; and
 wherein if the value of the current is greater than the first predetermined current value and current flow lasts for at least a first predetermined time period, the controller switches off the switching unit, so that the relay is switched off.

2. The power battery assembly of claim 1, further comprising:
a power source configured to power the relay, the controller, and the current sensing unit, wherein the switching unit is connected in series between the power source and the relay.

3. The power battery assembly of claim 1, wherein the relay, the controller, and the current sensing unit are powered by at least one of the plurality of the battery modules, wherein the switching unit is connected in series between the at least one of the plurality of the battery modules and the relay.

4. The power battery assembly of claim 1, wherein the switching unit comprises:
   a first MOSFET and a second MOSFET connected in series, with grid electrodes thereof connected with output terminals of the controller, respectively.

5. The power battery assembly of claim 1, wherein the current sensing unit is a Hall-effect sensor.

6. The power battery assembly of claim 5, wherein the Hall-effect sensor comprises:
   a first lead supporting member formed with an aperture through which a first lead connecting the relay with the battery circuit via the Hall sensor passes; and
   a first elastic washer provided between the aperture and the first lead passing therethrough.

7. The power battery assembly of claim 1, further comprising:
   a battery supporting tray configured to support the battery modules;
   a lead supporting bracket configured to support and fix a second lead connecting the relay with the battery circuit; and
   wherein
   the lead supporting bracket is supported on the battery supporting tray.

8. The power battery assembly of claim 7, wherein the lead supporting bracket comprises:
   a base fixed on the battery supporting tray;
   a lower semi-ring fixed to the base;
   an upper semi-ring mated with the lower semi-ring via flanges formed on the upper and lower semi-rings, respectively; and
   wherein
   a second elastic washer is provided between the second lead and an opening formed by the mated lower and upper semi-rings.

9. The power battery assembly of claim 1, wherein a switch is electrically connected in series between the circuit protecting unit and the battery circuit.

10. The power battery assembly of claim 1, wherein the switching unit is switched off under the control of the controller if the current detected by the current sensing unit has a value larger than a second predetermined current value, and the second predetermined current value is greater than the first predetermined current value, and current flow lasts for at least a second predetermined time period.

11. A power battery assembly for an electric vehicle, comprising:
   a battery circuit having a plurality of battery modules;
   a circuit protecting unit connected with the battery circuit, the circuit protecting unit having:
      a relay and a current sensing unit coupled in series with the battery circuit, the current sensing unit configured to detect a value of a current passing through the relay,
      a switching unit connected with the relay configured to control the relay;
      a controller connected with the switching unit and to the current sensing unit, an configured to control switching on or off the switching unit; and
      wherein if the value of the current is greater than a first predetermined current value and current flow lasts for at least a first predetermined time period, the controller switches off the switching unit, so that the relay is switched off.

\* \* \* \* \*